US012300338B2

(12) United States Patent
Chen et al.

(10) Patent No.: US 12,300,338 B2
(45) Date of Patent: May 13, 2025

(54) CONFIGURABLE SCAN CHAIN ARCHITECTURE FOR MULTI-PORT MEMORY

(71) Applicant: Arm Limited, Cambridge (GB)

(72) Inventors: Andy Wangkun Chen, Austin, TX (US); Vianney Antoine Choserot, Antibes (FR); Yew Keong Chong, Austin, TX (US); Khushal Gelda, Bangalore (IN)

(73) Assignee: Arm Limited, Cambridge (GB)

( * ) Notice: Subject to any disclaimer, the term of this patent is extended or adjusted under 35 U.S.C. 154(b) by 58 days.

(21) Appl. No.: 17/953,271

(22) Filed: Sep. 26, 2022

(65) Prior Publication Data

US 2023/0402122 A1  Dec. 14, 2023

Related U.S. Application Data

(60) Provisional application No. 63/351,987, filed on Jun. 14, 2022.

(51) Int. Cl.
*G11C 29/32* (2006.01)
*G11C 29/12* (2006.01)
*G11C 29/54* (2006.01)

(52) U.S. Cl.
CPC .......... *G11C 29/32* (2013.01); *G11C 29/1201* (2013.01); *G11C 29/54* (2013.01)

(58) Field of Classification Search
CPC ..... G11C 29/32; G11C 29/1201; G11C 29/54; G11C 29/3602
See application file for complete search history.

(56) References Cited

U.S. PATENT DOCUMENTS

| | | |
|---|---|---|
| 7,831,877 B2 | 11/2010 | Sul et al. |
| 8,441,279 B2 | 5/2013 | Lee et al. |
| 8,484,278 B2 | 7/2013 | Ray et al. |
| 8,516,316 B2 | 8/2013 | Lam et al. |
| 8,604,745 B2 | 12/2013 | Villwock et al. |
| 8,633,725 B2 | 1/2014 | Gorti et al. |
| 9,009,552 B2 | 4/2015 | Kwan et al. |
| 9,121,892 B2 | 9/2015 | Lamb et al. |
| 9,362,837 B2 | 6/2016 | Diedrichs et al. |
| 9,383,766 B2 | 7/2016 | Charlebois et al. |
| 9,568,551 B1 | 2/2017 | Kataria et al. |
| 9,666,302 B1 | 5/2017 | Chang et al. |
| 9,746,519 B2 | 8/2017 | Pugliesi-Conti |

(Continued)

FOREIGN PATENT DOCUMENTS

TW  201005749 A  2/2010

*Primary Examiner* — Mark D Featherstone
*Assistant Examiner* — Rong Tang
(74) *Attorney, Agent, or Firm* — Pramudji Law Group PLLC; Ari Pramudji

(57) ABSTRACT

Various implementations described herein are related to a device having first datapath circuitry with input devices that receive data from a number of write ports and provide first data. The device may have second datapath circuitry with logic gates that receive the first data from the input devices and provide the first data based on a read bitline signal. The device may have third datapath circuitry with output devices that receive the first data from the logic gates and provide second data to a number of read ports. Also, the number of read ports is greater than the number of write ports.

20 Claims, 7 Drawing Sheets

(56) References Cited

U.S. PATENT DOCUMENTS

| | | |
|---|---|---|
| 9,767,905 B2 | 9/2017 | Wang |
| 10,847,211 B2 | 11/2020 | Chen et al. |
| 10,938,383 B2 | 3/2021 | Hwang et al. |
| 11,056,183 B2 * | 7/2021 | Chong .................... G11C 5/025 |
| 11,568,926 B2 | 1/2023 | Chen et al. |
| 2006/0017685 A1 | 1/2006 | Tseng et al. |
| 2008/0094932 A1 | 4/2008 | Park et al. |
| 2009/0161454 A1 | 6/2009 | Lee |
| 2009/0300448 A1 | 12/2009 | Tomita et al. |
| 2010/0153796 A1 | 6/2010 | Rachapalli |
| 2010/0244853 A1 | 9/2010 | Tong et al. |
| 2011/0060952 A1 | 3/2011 | Asai et al. |
| 2011/0066906 A1 | 3/2011 | Tang |
| 2011/0072323 A1 | 3/2011 | Chong et al. |
| 2011/0304353 A1 | 12/2011 | Lee et al. |
| 2012/0246528 A1 | 9/2012 | Pugliesi-Conti |
| 2013/0080847 A1 * | 3/2013 | Zorian .................... G11C 29/16 |
| | | 714/E11.169 |
| 2014/0047293 A1 | 2/2014 | Lamb et al. |
| 2016/0064054 A1 | 3/2016 | Chen et al. |
| 2016/0349320 A1 | 12/2016 | Laisne et al. |
| 2019/0325947 A1 * | 10/2019 | Chen ..................... G11C 7/106 |
| 2019/0325950 A1 * | 10/2019 | Chong .................. G11C 11/418 |

\* cited by examiner 200A  6R6W Scan Capture Output Table (X = Y) 204,204A

6R6W (X = Y)

| RP (X) | QA0 | QA1 | QA2 | QA3 | QA4 | QA5 | 6R |
|---|---|---|---|---|---|---|---|
| WP (Y) | DB0 | DB1 | DB2 | DB3 | DB4 | DB5 | 6W |

FIG. 2A 200B  6R4W Scan Capture Output Table (X > Y) 204,204B

6R4W (X > Y)

| RP (X) | QA0 | QA1 | QA2 | QA3 | QA4 | QA5 | 6R |
|---|---|---|---|---|---|---|---|
| WP (Y) | DB0 | DB1 | DB2 | DB3 | DB3 (Config) | | 4R |

FIG. 2B 200C  6R12W Scan Capture Output Table (X < Y) 204,204C

6R12W (X < Y)

| RP (X) | QA0 | QA1 | QA2 | QA3 | QA4 | QA5 | 6R |
|---|---|---|---|---|---|---|---|
| WP (Y) | DB0 | DB1 | DB2 | DB3 | DB4 | DB5 | 12W |
| | DB6 | DB7 | DB8 | DB9 | DB10 | DB11 | |
| | Configurable DB (DB6 – DB11) | | | | | | |

FIG. 2C

6R12W Scan Capture Input-Output (IO) Signal Table (X < Y) 304

6R12W (X < Y)

| CLKA = CLKB | DB | SI | DFTRA MBYP | SE | QA0 | QA1, QA2, QA3, QA4 | QA5 | Description |
|---|---|---|---|---|---|---|---|---|
| R | X | X | 0 | X | MEM(@AA0) | -- | MEM(@AA5) | Functional Read Mode from Read Port 0 |
| R | DB* | X | 1 | 0 | DB0 \| DB6 | -- | DB5 \| DB11 | Capture from DB* (Launch to QAs) |
| R | X | SI | 1 | 1 | Scan Shift | -- | Scan Shift | Scan Shift (Launch QAs) |

4R3W Scan Capture Input-Output (IO) Signal Table (Single-Bit) 504

4R3W (Single-Bit)

| CLKA/CLKB | DB | SI | DFTRAMBYP | SE | QA0 | QA1 | QA2 | QA3 | Description |
|---|---|---|---|---|---|---|---|---|---|
| CLKA=R | X | X | 0 | X | MEM (@AA0) | MEM (@AA1) | MEM (@AA2) | MEM (@AA3) | Functional Read Mode from Read Port 0 |
| CLKA=R | DB* | X | 1 | 0 | DB0 | DB1 | DB2 | DB3 | Capture from DB* (Launch to QAs) |
| CLKA=R | X | SI | 1 | 1 | Scan Shift | Scan Shift | Scan Shift | Scan Shift | Scan Shift (Launch QAs) |

CONFIGURABLE SCAN CHAIN ARCHITECTURE FOR MULTI-PORT MEMORY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional semiconductor fabrication designs, embedded scan chains may include scan chains where write data-in, write enable, and read data-out include full scan flip-flops. Also, these embedded scan chains may be used for asynchronous clock design where data (D) and write enable (WEN) capture uses write-clock (WCLK) and Q-out uses read-clock (RCLK). These many signals and associated circuitry may cause a large area footprint on circuit architecture. Thus, in some modern circuit designs, a re-design of scan chains may therefore be needed to reduce area of integrated circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 2A-2C illustrate diagrams of scan capture output tables for multi-port memory applications in accordance with various implementations described herein.

FIG. 3 illustrates a diagram of scan capture input-output (IO) signal table for multi-port memory applications in accordance with implementations described herein.

FIG. 5 illustrates a diagram of scan capture input-output (IO) signal table for multi-port memory applications in accordance with implementations described herein.

DETAILED DESCRIPTION

Figure 1A:
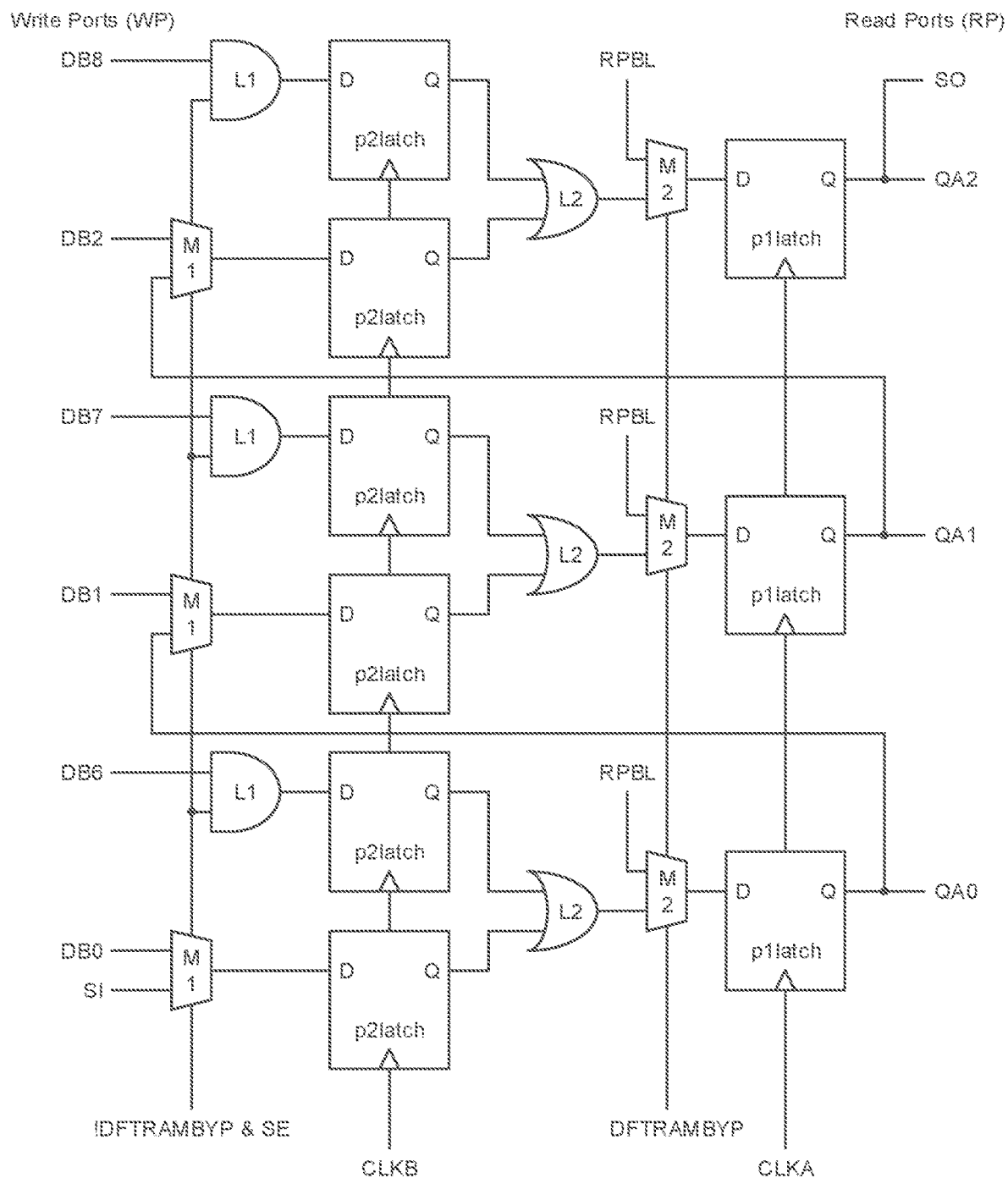
FIGS. 1A-1B illustrate diagrams of scan chain architecture for multi-port memory applications in accordance with various implementations described herein.

Various implementations described herein are directed to efficient and scalable DFT (Design-for-Test) scan chain architecture designs for multi-port memory applications in various scan chain applications. Various implementations described herein provide for embedded full scan chain designs, schemes and techniques for various integrated circuit (IC) memory applications. The various schemes and techniques described herein enable area efficient memory design with an embedded full scan chain by reducing a number of scan-shift chains, e.g., in an input/output (I/O) column multiplexer (colmux). Also, various schemes and techniques described herein may further address flop count reductions by unifying scan chains in the presence of asynchronous read and write clock domains and by reducing observability latches of control inputs.

Various implementations described herein enable area efficient and/or scalable solutions for embedded full scan chain in multi-port memory applications. Thus, in various applications, scan chain architecture designs described herein enable re-using functional input/output (IO) datapath latches for DFT scan chain without adding any non-functional latches so as to improve area and match timing between operational modes. Therefore, various solutions and implementations described herein are configurable and/or scalable to any number of read/write ports, such as, e.g., 12R6W, 9R9W, 6R12W, etc.

Various implementations described herein enable area efficient and/or scalable solutions for multi-port memory designs that have many read and write ports, and/or have unequal numbers of read ports and write ports. Also, various implementations described herein reduce the number of scan chains for multi-port memory from many to one, wherein scan chain schemes and techniques described herein reduces the number of scan flops by unifying scan chains even with many and unequal number of read and write ports in a multi-port memory. Some novel features and characteristics described herein may re-use functional datapath input-output (IO) latches for DFT scan chains so as to thereby reduce area impact and to match timing between different operational modes without additional latches. Also, even with unequal numbers of read ports (RP) and write ports (WP), these read-write ports are controllable, scalable and observable through scan capture/shift, and also, these read-write ports are easily scalable to different number of port configurations, such that different RP-WP configurations may be implemented and used in various multi-port memory architecture designs. In some instances, the number of read ports (RP) may be equal to the number of write ports (WP), such as, e.g., 3R3W, 7R7W, 9R9W, etc. Also, in other instances, the number of read ports (RP) may be greater than the number of write ports (WP), such as, e.g., 12R6W, 9R8W, 4R3W, etc. Further, in various other instances, the number of read ports (RP) may be less than the number of write ports (WP), such as, e.g., 6R12W, 5R7W, 4R12W, etc.

Various implementations of scan chain architecture for memory applications will now be described in detail herein with reference to FIGS. 1-6.

FIG. 1A illustrates a diagram 100A of scan chain architecture 104A for multi-port memory applications in accordance with various implementations described herein.

In various implementations, the scan chain architecture 104A in FIG. 1A may be implemented as a system or a device having integrated circuitry (IC) and components that are arranged and coupled together as an assemblage or some combination of parts that may provide for physical circuit layout design and related structures. In various instances, a method of designing, fabricating, building and/or providing the scan chain architecture 104A as an integrated system or device may involve use of IC circuit components described herein so as to thereby implement various configurable scan chain architecture schemes and techniques associated therewith. Moreover, the scan chain architecture 104A may be integrated with various computing circuitry and related components on a single chip, and also, the scan chain architecture 104A may be implemented within embedded systems for automotive, electronic, mobile, server and Internet-of-things (IoT) applications.

As shown in FIG. 1A, the scan chain architecture 104A may include first datapath circuitry having input latches (p2latch) that receive data (D) from a number of write ports (WP) and provide first latched data (Q) signals based on clock signal (CLKB). In various applications, the write ports (WP) may be associated with a number of D-input ports (DB0, DB1, . . . , DB8), and other inputs may include a scan input (SI) along with a design-for-test (DFT) random access memory (RAM) bypass (BYP) signal, which may be referred to as a DFTRAMBYP signal, and (&) a sense-amp enable signal (SE). Further, an inverted DFTRAMBYP signal may be referred to as !DFTRAMBYP signal.

In some implementations, the scan chain architecture 104A may have a number of input logic gates (L1) and a number of multiplexers (M1) that receive the D-input signals (DB0, DB1, . . . , DB8) and provide data (D) input signals to input latches (p2latch). Also, as shown in FIG. 1A, the scan chain architecture 104A may include multiple input latches (e.g., two p2latches) per data port that latch multiple input data signals (DB0, DB1, . . . , DB8) provided by the input logic gates (L1) and the multiplexers (M1).

Also, in some applications, multiple D-input signals (DB0, DB1, . . . , DB8) may be provided to L1 logic gates and/or M1 multiplexers, and output from the L1 logic gates and/or M1 multiplexers may be provided to the D-inputs of input latches (p2latch). Also, the M1 multiplexers may provide output signals to the D-inputs of input latches (p2latch) based on the !DFTRAMBYP signal. Also, in various applications, the L1 logic gates may refer to AND gates, and the M1 multiplexers may refer to 2-to-1 multiplexers; however, various other configurations may be possible.

In some implementations, the scan chain architecture 104A may include second datapath circuitry having logic gates (L2, M2) that receive the first latched data (Q) from the input latches (p2latch) and provide the first latched data (Q) based on a read bitline signal (RPBL). Also, in some applications, multiple latched Q-output signals from multiple input latches (p2latch) per data port may be provided to L2 logic gates, and output from the L2 logic gates may be provided to the M2 multiplexers along with the RPBL signal. Also, the M2 multiplexers may provide output signals to the D-inputs of output latches (p1latch) based on the DFTRAMBYP signal and the RPBL signal.

In some implementations, the scan chain architecture 104A may further include third datapath circuitry having output latches (p1latch) that receive the first latched data (e.g., Q output) signals from logic gates (L2, M2) and then provide second latched data (QA0, QA1, QA2) to a number of read ports (RP) based on clock signal (CLKA). Also, in some applications, one or more of the second latched data (QA0, QA1, QA2) may be provided as feedback signals to the M1 multiplexers, and further, at least one of the second latched data signals (e.g., QA2) may be used as a scan output (SO) signal. Also, in some applications, the CLKA signal is equal to the CLKB signal. In various applications, the L2 logic gates may refer to OR gates, and the M2 multiplexers may refer to 2-to-1 multiplexers; however, various other configurations may be possible.

In various applications, as described in greater detail herein, the number of read ports (RP) may be less than (<) the number of write ports (WP), the number of read ports (RP) may be greater than (>) the number of write ports (WP), or the number of read ports (RP) may be equal to (=) the number of write ports (WP). In various applications, the scan chain architecture 104A may refer to configurable scan chain architecture, and therefore, in various applications, the scan chain architecture 104A may implemented in a device with a memory design-for-test (DFT) design for multi-port memory applications.

For instance, in some applications, as shown in FIG. 1A, the number of D-input ports (e.g., DB0, DB1, . . . , DB6) of the input latches (P2latch) may refer to 6 write ports (e.g., 6WP or 6W), and also, the number of read ports (e.g., QA0, QA1, QA2) of the output latches (p1latch) may refer to 3 read ports (e.g., 3RP or 3R). In this scenario, the scan chain architecture 104A may be configured as 3-read and 6-write (3R6W) scan chain architecture that may be used for multi-port memory architecture. In various implementations, the configuration shown in FIG. 1A may be selectively configurable (or scalable) for any other number (X) of read ports (RP) and any other number (Y) or write ports (WP), such as, e.g., 6-read and 12-write (6R12W) scan chain architecture, in a manner as further described herein.

In various implementations, clock circuitry may be used to provide clock signal (CLKB) to the input latches (p2latch) and also provide clock signal (CLKA) to the output latches (p1latch). Thus, the multiple clock signals may include a first clock signal (CLKA) that may be used as a scan shift signal during a first mode of operation, and the multiple clock signals may also include a second clock signal (CLKB) that may be used as a scan capture signal during a second mode of operation.

In various implementations, as shown in reference to FIG. 1A, the input latches (p2latch) may include multiple latches (e.g., two latches) per data bit, the output latches (p1latch) may include a single latch (e.g., one latch) per data bit, and the logic gates (L2, M2) may be coupled between the input latches (p2latch) and the output latches (p1 latch), wherein the logic gates (L2, M2) may combine the first latched data per data port from the multiple latches (e.g., two latches per data bit) into single latched data (e.g., one latch per data bit) provided to the output latches (p1latch). In various applications, the number of input latches (e.g., two p2latches per data bit) is greater than the number of output latches (e.g., one p1latch per data bit). Thus, the input latches (P2latch) comprise two (2) latches per data bit, and the output latches (p1latch) comprise one (1) latch per data bit.

In various implementations, as shown in reference to FIG. 1A, the logic gates (L2, M2) include multiple logic gates per data port including, e.g., a first logic gate (L2) and a second logic gate (M2). Also, the first logic gate (L2) receives multiple first latched data per data port from at least two (2) input latches of the input latches (p2latch) and provides single first latched data to the second logic gate (M2). Also, the second logic gate (M2) receives the single first latched data from the first logic gate (L2), receives the read bitline signal (RPBL), and provides the single first latched data to the output latch (p1latch) per data port based on a design-for-test (DFT) signal (DFTRAMBYP).

Figure 1B:
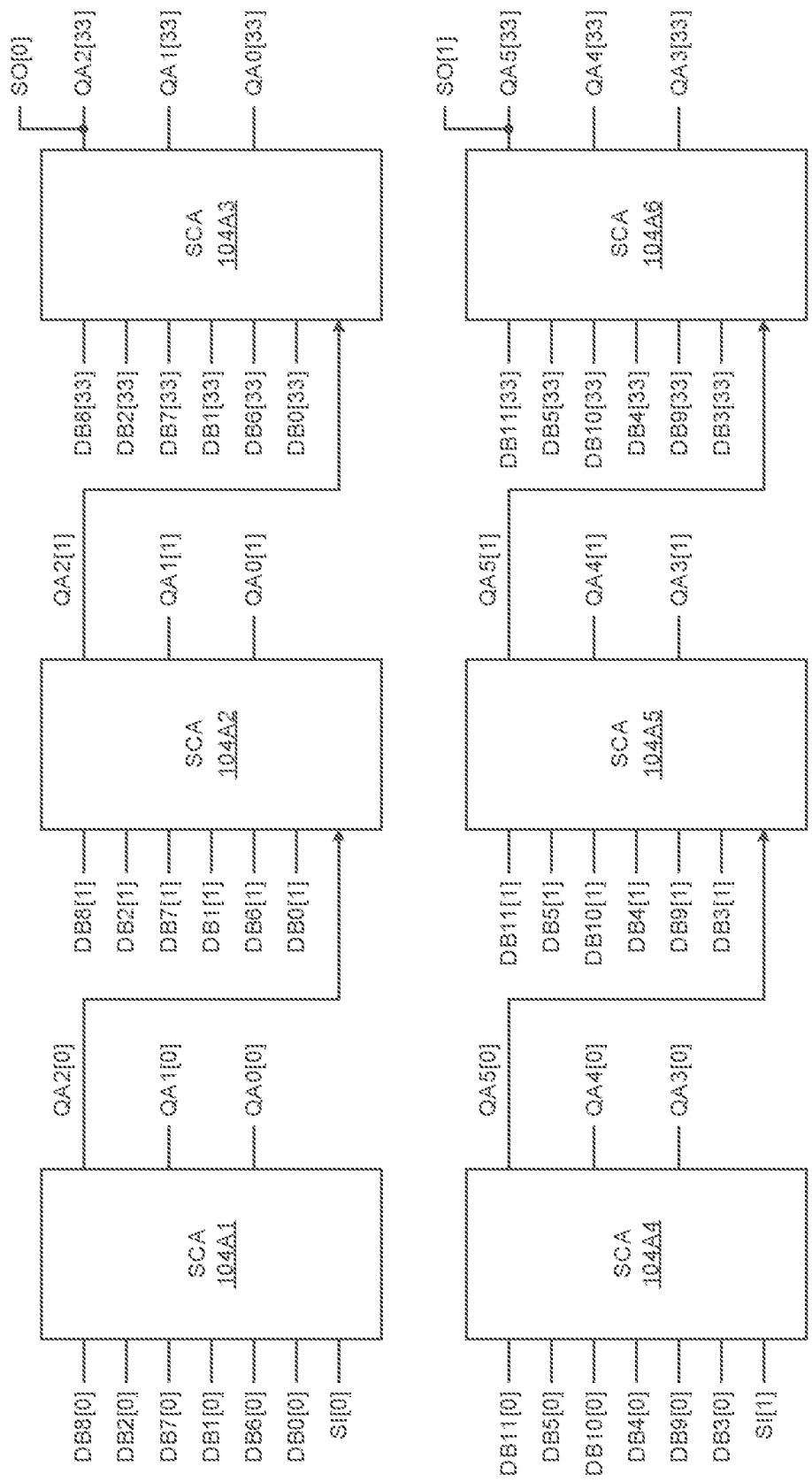

FIG. 1B illustrates a diagram 100B of scan chain architecture 104B for multi-port memory applications in accordance with implementations described herein. In some applications, a flip-flop may be implemented with two back-to-back latches. As shown in FIG. 1B, the scan chain architecture 104B may be configured as a repeating circuit that is configured to repeat (or daisy-chain) the scan chain architecture (SCA) 104A, wherein at least one output read port (e.g., RP: QA2) is coupled to the scan input (S1) of the next SCA 104A in a daisy-chain configuration. In this instance, one or more of the input write ports (e.g., DB1, DB2, DB3, DB4) may be provided to multiple separate latches.

Also, in some applications, as shown in FIG. 1B, the number of D-input ports (e.g., DB0, DB1, . . . , DB11) may refer to 12 write ports (e.g., 12WP or 12W), and the number of read ports (e.g., QA0, QA1, . . . , QA5) of the output latches (p1latch) may refer to 6 read ports (e.g., 6RP or 6R). In this scenario, the scan chain architecture 104B may be configured as 6-read and 12-write (6R12W) scan chain architecture that may be used for multi-port memory architecture. Further, this configuration shown in FIG. 1B may be selectively configurable for any other number (X) of read ports (RP) and any other number (Y) or write ports (WP), e.g., as further described herein.

For instance, input write ports (DB8[0], DB2[0], DB7[0], DB1 [0], DB6[0], DB0[0], SI[0]) may be provided to SCA 104A1, which then provides output read ports (QA2[0], QA1[0], QA0[0]). In a next instance, input write ports (DB8[1], DB2[1], DB7[1], DB1[1], DB6[1], DB0[1], QA2 [0]) may be provided to SCA 104A2, which then provides output read ports (QA2[1], QA1[1], QA0[1]). In a next instance, input write ports (DB8[33], DB2[33], DB7[33], DB1[33], DB6[33], DB0[33], QA2[0]) may be provided to SCA 104A3, which then provides output read ports (SO[0], QA2[33], QA1[33], QA0[33]).

Also, in a next instance, input write ports (DB11[0], DB5[0], DB10[0], DB4[0], DB9[0], DB3[0], SI[1]) may be provided to SCA 104A4, which then provides output read ports (QA5[0], QA4[0], QA3[0]). In a next instance, input write ports (DB11[1], DB5[1], DB10[1], DB4[1], DB9[1], DB3[1], QA5[0]) may be provided to SCA 104A5, which then provides output read ports (QA5[1], QA4[1], QA3[1]). In a next instance, input write ports (DB11[33], DB5[33], DB10[33], DB4[33], DB9[33], DB3[33], QA5[1]) may be provided to SCA 104A6, which then provides output read ports (SO[1], QA5[33], QA4[33], QA3[33]).

FIGS. 2A-2C illustrate various diagrams of scan capture output tables 204 for multi-port memory applications in accordance with implementations described herein. In particular, FIG. 2A shows a diagram 200A of a scan capture output table 204A for multi-port memory applications with a number of read ports (RP:X) equal (=) to a number of write ports (WP:Y), FIG. 2B shows a diagram 200B of a scan capture output table 204B for multi-port memory applications with the number of read ports (RP:X) greater than (>) the number of write ports (WP:Y), and FIG. 2C shows a diagram 200C of a scan capture output table 204C for multi-port memory applications with the number of read ports (RP:X) less than (<) the number of write ports (WP:Y).

FIG. 2A shows a diagram 200A of a scan capture output table 204A for multi-port memory applications with the number of read ports (RP:X) equal (=) to the number of write ports (WP:Y). In some implementations, the scan capture output table 204A may refer to a data input-output (IO) table that describes IO characteristics of the scan chain architecture 104A in FIG. 1A when it is configured for multi-port memory having an equal number of read ports (RP) and write ports (WP), wherein RP=WP.

As shown in FIG. 2A, the scan capture output table 204A provides for 6R6W multi-port memory having six read ports (6RP) and six write ports (6WP). The read ports (RP:R:X) may refer to six (6) Q-outputs (6R: QA0, QA1, . . . , QA5) from the output latches (ph1latch) of the scan chain architecture 104A in FIG. 1A, and the write ports (WP:W:Y) may refer to six (6) D-inputs (6W: DB0, DB1, . . . , DB5) to the input latches (ph2latch) of the scan chain architecture 104A in FIG. 1A.

In various implementations, the scan chain architecture 104A shown in FIG. 1A is scalable and thus may be modified and/or configured to have any number of DB-inputs and any number of QA-outputs so as to provide for 6R6W multi-port memory having six read ports (6RP) and six write ports (6WP). However, many other RP=WP configurations are possible, such as, e.g., 3R3W, 4R4W, 5R5W, etc. For instance, in some applications, as shown FIG. 6, the scan chain architecture 104A shown in FIG. 1A may be modified and/or configured to provide for 3R3W scan chain architecture 604.

FIG. 2B shows a diagram 200B of a scan capture output table 204B for multi-port memory applications with the number of read ports (RP:X) at least greater than (>) the number of write ports (WP:Y). In various implementations, the scan capture output table 204B may refer to a data input-output (IO) table that describes IO characteristics of the scan chain architecture 104A in FIG. 1A when it is configured for multi-port memory having a greater number of read ports (RP) than write ports (WP), wherein RP>WP.

In various applications, the scan chain architecture 104A shown in FIG. 1A may refer to a configurable scan chain architecture, and therefore, in some implementations, the scan chain architecture 104A shown in FIG. 1A may be implemented in a device with 6 read ports (RP) and 4 write ports (WP), wherein the number of read ports (e.g., 6RP: 6R:6X) may be greater than the number of write ports (e.g., 4WP:4W:4Y). Therefore, in various applications, the number of write ports (WP:W:Y) may be equal to or greater than two (2) write ports (2WP:2W:2Y), and the number of read ports (RP:R:X) may be equal to or greater than three (3) write ports (3RP:3R:3X), such that the number of read ports (RP) is at least greater than the number of write ports (WP), wherein RP>WP.

As shown in FIG. 2B, the scan capture output table 204B provides for 6R4W multi-port memory having six read ports (6RP) and six write ports (4WP). The read ports (RP:R:X) may refer to six (6) Q-outputs (6R: QA0, QA1, . . . , QA5) from the output latches (ph1latch) of the scan chain architecture 104A in FIG. 1A, and the write ports (WP:W:Y) may refer to four (4) D-inputs (4W: DB0, DB1, . . . , DB3) to the input latches (ph2latch) of the scan chain architecture 104A in FIG. 1A. In some applications, extra QA-outputs may be mirrored during scan capture/shift, e.g., in reference to the 6R4W configuration, the DB3-output may be captured to QA3, QA4 and QA5.

In various implementations, the scan chain architecture 104A shown in FIG. 1A is scalable and thus may be modified and/or configured to have any number of DB-inputs and any number of QA-outputs so as to provide for 6R4W multi-port memory having six read ports (6RP) and four write ports (4WP). However, other RP=WP configurations may be possible, such as, e.g., 4R3W, 5R4W, 5R3R, etc. For instance, in some applications, as shown FIG. 4, the scan chain architecture 104A shown in FIG. 1A may be modified and/or configured to provide for 4R3W scan chain architecture 404.

FIG. 2C shows a diagram 200C of a scan capture output table 204C for multi-port memory applications with the number of read ports (RP:X) less than (<) the number of write ports (WP:Y). In some implementations, the scan capture output table 204C may refer to a data input-output (IO) table that describes IO characteristics of the scan chain architecture 104A in FIG. 1A when it is configured for multi-port memory having a smaller number of read ports (RP) than write ports (WP), wherein RP<WP.

In various applications, the scan chain architecture 104A shown in FIG. 1A may refer to a configurable scan chain architecture, and therefore, in some implementations, the scan chain architecture 104A shown in FIG. 1A may be implemented in a device with 6 read ports (RP) and 12 write ports (WP), wherein the number of read ports (e.g., 6RP: 6R:6X) may be less than the number of write ports (e.g., 12WP:12W:12Y). Therefore, in various applications, the number of write ports (WP:W:Y) may be equal to or greater than three (3) write ports (3WP:3W:3Y), and the number of read ports (RP:R:X) may be equal to or greater than two (2) read ports (2RP:2R:2X), such that the number of read ports (RP) is at least less than the number of write ports (WP), wherein RP<WP.

In some applications, the number of write ports (WP:W:Y) may be greater than (>) the number of read ports (RP:R:X), and thus, in some scenarios, the number of read ports (RP:R:X) may be equal to or greater than (>) two (2) read ports (2RP:2R:2X), and the number of write ports (WP:W:Y) may be equal to or greater than (>) three (3) write ports (3WP:3W:3Y), such that the number of write ports (WP) is at least greater than (>) the number of read ports (RP), wherein WP>RP.

As shown in FIG. 2C, the scan capture output table 204C provides for 6R12W multi-port memory having six read ports (6RP) and twelve write ports (12WP). The read ports (RP:R:X) may refer to six (6) Q-outputs (6R: QA0, QA1, . . . , QA5) from the output latches (ph1latch) of the scan chain architecture 104A in FIG. 1A, and the write ports (WP:W:Y) may refer to twelve (12) D-inputs (12W: DB0, DB1, . . . , DB11) to the input latches (ph2latch) of the scan chain architecture 104A in FIG. 1A. In various applications, two DB-inputs may be OR-gated into QA-latches, e.g., in reference to the 6R12W configuration, the DB0-DB5 are captured to QA0-QA5, and QA6-QA11 are captured to QA0-QA5.

In various implementations, the scan chain architecture 104A shown in FIG. 1A is scalable and thus may be modified and/or configured to have any number of DB-inputs and any number of QA-outputs so as to provide for 6R12W multi-port memory having six read ports (6RP) and twelve write ports (12WP). However, other RP=WP configurations may be possible, such as, e.g., 3R6W, 4R6W, 4R8W, 5R8W, etc. For instance, in various applications, as shown FIG. 1A, the scan chain architecture 104A may be modified and/or configured to provide for the 6R12W scan chain architecture 104A.

FIG. 3 illustrates a diagram 300 of scan capture input-output (IO) signal table 304 for multi-port memory in accordance with implementations described herein.

In various applications, the scan chain architecture 104A shown in FIG. 1A refers to a configurable scan chain architecture that is configured to provide the scan capture 10 table 304 shown in FIG. 3 for multi-port memory. Therefore, in some implementations, the scan chain architecture 104A as in FIG. 1A may be implemented as a 6R12W device with 6 read ports (RP) and 12 write ports (WP), wherein the number of read ports (e.g., 6RP:6R:6X) may be less than the number of write ports (e.g., 12WP:12W:12Y).

In various implementations, the scan chain architecture 104A shown in FIG. 1A may be configured to support unequal numbers of DB-input ports and QA-output ports, wherein functional latches may be reused to reduce area impact and so as to match timing between functional memory modes and DFT modes (i.e., Design-for-Test modes). Also, in some applications, multiple synchronous clocks (e.g., CLKA, CLKB) may be used such that CLKA=CLKB. Also, in some applications, the scan chain shift order on QB/QA may refer to SI→QA0→ QA1→ . . . →QA4→QA5/SO. In other applications, the scan chain architecture 104A shown in FIG. 1A may be modified, configured and/or extended so as to support additional write ports using OR3 (i.e., 3-input OR gate), wherein, e.g., in reference to a 4R12W configuration, 3-DB inputs may be OR-gated into a single (1) QA.

As shown in FIG. 3, the scan capture 10 table 304 refers to a 6R12W scan capture 10 table, wherein the number of read ports is less than the number of write ports, such that RP(X)<WP (Y). In a functional read mode from read port 0 (QA0), as shown in the first row of the table 304, for a read (R) operation, CLKA=CLKB, and DFTRAMBYP=0, and thus, QA0 is stored/shifted into memory address location AA0, i.e., MEM(@AA0), and QA5 is stored/shifted into memory address location AA5, i.e., MEM(@AA0).

Also, in some applications, in a capture write mode to write port DB-input (DB*), as shown in the second row of the table 304, for a write (W) operation, CLKA=CLKB, and DFTRAMBYP=1, and scan enable=0, and thus, QA0 is used to capture DB0-DB6, and QA5 is used to capture DB5-DB11.

Also, in some applications, in a scan-shift mode to scan input (SI), as shown in the third row of the table 304, for scan-input operation, CLKA=CLKB, and DFTRAMBYP=1, and scan enable=1, and thus QA0 is scan-shifted, and QA5 is scan-shifted.

Figure 4:
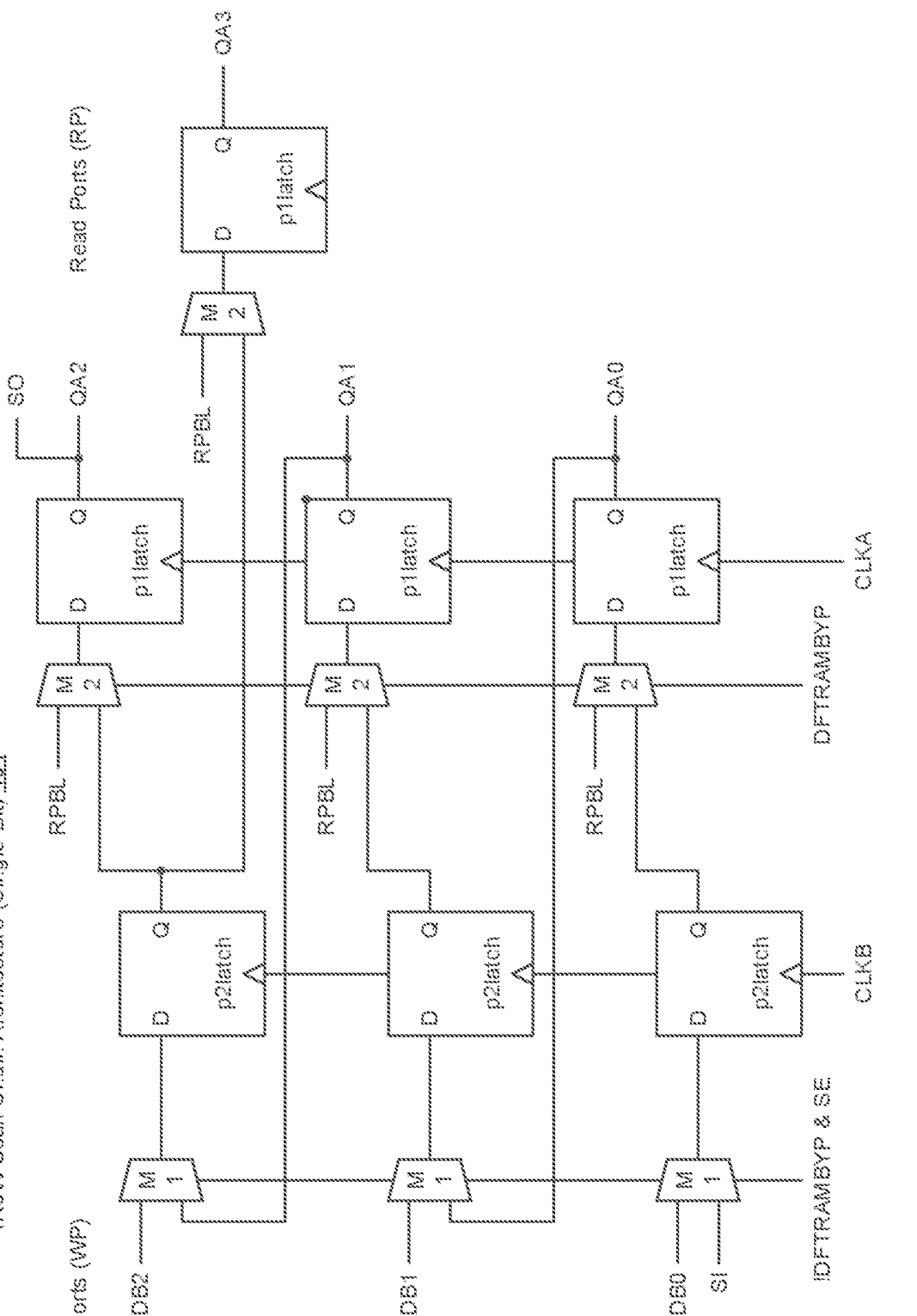
FIG. 4 illustrates a diagram of scan chain architecture for multi-port memory applications in accordance with various implementations described herein.

FIG. 4 illustrates a diagram 400 of scan chain architecture 404 for multi-port memory applications in accordance with implementations described herein. In reference to FIG. 4, various circuit components as described therein are similar in scope, features and functionality to various related components as shown and described in reference to the scan chain architecture 104A shown in FIG. 1A. In various applications, the scan chain architecture 404 shown in FIG. 4 may be implemented in a 4R3W device having 4 read ports (RP) and 3 write ports (WP), wherein the number of read ports (e.g., 4RP:4R:4X) may be greater than the number of write ports (e.g., 3WP:3W:3Y).

In various implementations, the scan chain architecture 404 in FIG. 4 may be implemented as a system or a device having integrated circuitry (IC) and components that are arranged and coupled together as an assemblage or some combination of parts that may provide for physical circuit layout design and related structures. In various instances, a method of designing, fabricating, building and/or providing the scan chain architecture 404 as an integrated system or device may involve use of IC circuit components described herein so as to thereby implement various configurable scan chain architecture schemes and techniques associated therewith. Moreover, the scan chain architecture 404 may be integrated with various computing circuitry and related components on a single chip, and also, the scan chain architecture 404 may be implemented within embedded systems for automotive, electronic, mobile, server and Internet-of-things (IoT) applications.

As shown in FIG. 4, the scan chain architecture 404 may include first datapath circuitry having input latches (p2latch) that receive data (D) from a number of write ports (WP) and provide first latched data (Q) signals based on clock signal (CLKB). In various applications, the write ports (WP) may be associated with a number of D-input ports (DB0, DB1, DB2), and other inputs may include a scan input (SI) along with the DFTRAMBYP signal, and (&) the sense-amp enable signal (SE). Also, an inverted DFTRAMBYP signal may be referred to as !DFTRAMBYP signal.

In some implementations, the scan chain architecture 404 may have a number of input multiplexers (M1) that receive the D-input signals (DB0, DB1, DB2) and provide data (D)

input signals to input latches (p2latch). Further, as shown in FIG. 4, the scan chain architecture 404 may have a single input latch (e.g., one p2latch) per data port that latches input data signals (DB0, DB1, DB2) provided by the input multiplexers (M1).

Also, in some applications, multiple D-input signals (DB0, DB1, DB2) may be provided to the M1 multiplexers, and output from the M1 multiplexers may be provided to the D-inputs of input latches (p2latch). Also, M1 multiplexers may provide output signals to the D-inputs of input latches (p2latch) based on the !DFTRAMBYP signal. In various applications, the M1 multiplexers may refer to 2-to-1 multiplexers; however, various other configurations may be possible.

In some implementations, the scan chain architecture 404 may include second datapath circuitry having multiplexers (M2) that receive the first latched data (Q) from the input latches (p2latch) and provide the first latched data (Q) based on a read bitline signal (RPBL). Also, in some applications, a single latched Q-output signal from multiple input latches (p2latch) per data port may be provided to M2 multiplexers, and the M2 multiplexers may provide output signals to the D-inputs of the output latches (p1latch) based on the DFTRAMBYP signal and the RPBL signal.

In some implementations, the scan chain architecture 404 may further include third datapath circuitry having output latches (p1latch) that receive the first latched data (e.g., Q output) signals from M2 multiplexers and then provide second latched data (QA0, QA1, QA2, QA3) to a number of read ports (RP) based on clock signal (CLKA). Also, in some applications, one or more of the second latched data (QA0, QA1) may be provided as feedback signals to the M1 multiplexers, and further, at least one of the second latched data signals (e.g., QA2) may be used as a scan output (SO) signal. In some applications, the CLKA signal is equal to the CLKB signal. In some applications, M2 multiplexers may refer to 2-to-1 multiplexers; however, various other configurations may be possible.

In various applications, as described in greater detail herein, the number of read ports (RP) may be greater than (>) the number of write ports (WP), wherein the number of output latches (p1latch) is greater than the number of input latches (p2latch). Also, in some applications, the number of read ports (RP:R:X) is greater than the number of write ports (WP:W:Y), such that RP>WP. Therefore, in various applications, the scan chain architecture 404 may refer to configurable scan chain architecture, wherein the scan chain architecture 404 may implemented in a 4R3W device with a memory design-for-test (DFT) design for multi-port memory applications.

For instance, in some applications, as shown in FIG. 4, the number of D-input ports (e.g., DB0, DB1, DB2) of the input latches (P2latch) may refer to 3 write ports (e.g., 3WP or 3W), and also, the number of read ports (e.g., QA0, QA1, QA2, QA3) of the output latches (p1latch) may refer to 4 read ports (e.g., 4RP or 4R). In this scenario, the scan chain architecture 404 may be configured as the 4-read and 3-write (4R3W) scan chain architecture that may be used for multi-port memory architecture. Also, this configuration shown in FIG. 4 may be selectively configurable for any other number (X) of read ports (RP) and any other number (Y) or write ports (WP), e.g., as described herein.

In various implementations, clock circuitry may be used to provide clock signal (CLKB) to the input latches (p2latch) and also provide clock signal (CLKA) to the output latches (p1latch). Thus, the multiple clock signals may include a first clock signal (CLKA) that may be used as a scan shift signal during a first mode of operation, and the multiple clock signals may also include a second clock signal (CLKB) that may be used as a scan capture signal during a second mode of operation.

In various implementations, as shown in reference to FIG. 4, the input latches (p2latch) may include a single latch (one p2latch) per data bit, the output latches (p1latch) may include a single latch (one latch) per data bit, and M2 multiplexers may be coupled between the input latches (p2latch) and the output latches (p1latch). Further, in various applications, the number of input latches (e.g., one p1 latch per data bit) is less than the number of output latches (e.g., one or two p1 latches per data bit). Thus, the input latches (P2latch) provide for 3 write ports (3WP:3W:3Y), and the output latches (p1latch) provide for 4 read ports (4RP:4R: 4X), wherein 4RP>3WP. Thus, the number of output latches (4 p1latches) is greater than the number of input latches (3 p2latches), and therefore, the number of read ports (4RP) is greater than the number of write ports (3WP).

FIG. 5 illustrates a diagram 500 of scan capture input-output (IO) signal table 504 for multi-port memory in accordance with implementations described herein.

In various applications, the scan chain architecture 104A shown in FIG. 1A refers to a configurable scan chain architecture that is configured to provide the scan capture 10 table 504 shown in FIG. 5 for multi-port memory. Therefore, in some implementations, the scan chain architecture 104A shown in FIG. 1A may be implemented in a 4R3W device with 4 read ports (RP) and 3 write ports (WP), such that the number of read ports (e.g., 4RP:4R:4X) may be greater than the number of write ports (e.g., 3WP:3W:3Y).

In various implementations, the scan chain architecture 104A shown in FIG. 1A may be configured to support unequal numbers of DB-input ports and QA-output ports, wherein functional latches may be reused to reduce area impact and so as to match timing between functional memory modes and DFT modes (i.e., Design-for-Test modes). Also, in some applications, multiple synchronous clocks (e.g., CLKA, CLKB) may be used such that CLKA=CLKB. Also, in some applications, the scan chain shift order on QB/QA may refer to SI[0]→QA0[0]→QA1[0]→QA2[0]→QA0[1]→ . . . , and further, QA3[*]=QA2[*]during the scan capture/shift mode of operation.

As shown in FIG. 5, the scan capture 10 table 504 may refer to a 4R3W scan capture 10 table, wherein the number of read ports (RP) may be greater than the number of write ports (WP), such that RP(X)>WP (Y). In a functional read mode from read port 0 (QA0), as shown in the first row of the table 504, for a read (R) operation, CLKA=CLKB, and DFTRAMBYP=0, and in some implementations, QA0 is stored/shifted into memory address location AA0, i.e., MEM (@AA0), and also, QA1 is stored/shifted into memory address location AA1, i.e., MEM(@AA1), and further, QA2 is stored/shifted into memory address location AA2, i.e., MEM(@AA2), and further, QA3 is stored/shifted into memory address location AA3, i.e., MEM(@AA3).

Also, in some applications, in a capture write mode to write port DB-input (DB*), as shown in the second row of the table 504, for a write (W) operation, CLKA=CLKB, and DFTRAMBYP=1, and scan enable=0, and in some implementations, QA0 is used to capture DB0, and QA1 is used to capture DB1, and QA2 is used to capture DB2, and QA3 is used to capture DB3.

Also, in some applications, in a scan-shift mode to scan input (SI), as shown in the third row of the table 504, for scan-input operation, CLKA=CLKB, and DFTRAM- BYP=1, and scan enable=1, and thus QA0 is scan-shifted, QA1 is scan-shifted, QA2 is scan-shifted, and also, QA3 is scan-shifted.

Figure 6:
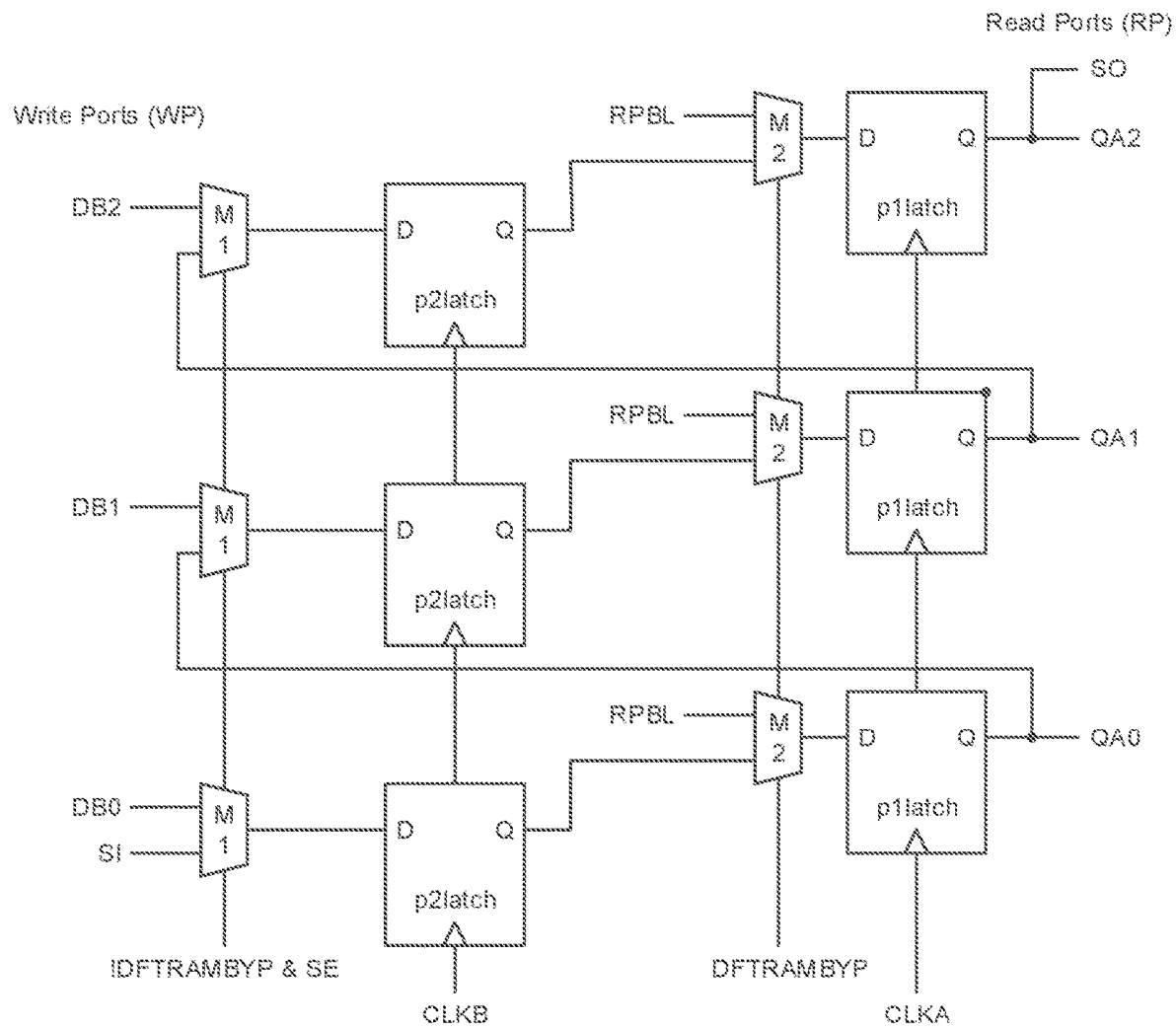
FIG. 6 illustrates a diagram of scan chain architecture for multi-port memory applications in accordance with various implementations described herein.

FIG. 6 illustrates a diagram 600 of scan chain architecture 604 for multi-port memory applications in accordance with implementations described herein. In reference to FIG. 6, various circuit components as described therein are similar in scope, features and functionality to various related components as shown and described in reference to the scan chain architecture 104A shown in FIG. 1A. In various applications, the scan chain architecture 604 shown in FIG. 6 may be implemented in a 3R3W device having 3 read ports (RP) and 3 write ports (WP), wherein the number of read ports (e.g., 3RP:3R:3X) may be equal to the number of write ports (e.g., 3WP:3W:3Y).

In various implementations, the scan chain architecture 604 in FIG. 6 may be implemented as a system or a device having integrated circuitry (IC) and components that are arranged and coupled together as an assemblage or some combination of parts that may provide for physical circuit layout design and related structures. In various instances, a method of designing, fabricating, building and/or providing the scan chain architecture 604 as an integrated system or device may involve use of IC circuit components described herein so as to thereby implement various configurable scan chain architecture schemes and techniques associated therewith. Moreover, the scan chain architecture 604 may be integrated with various computing circuitry and related components on a single chip, and also, the scan chain architecture 604 may be implemented within embedded systems for automotive, electronic, mobile, server and Internet-of-things (IoT) applications.

As shown in FIG. 6, the scan chain architecture 604 may include first datapath circuitry having input latches (p2latch) that receive data (D) from a number of write ports (WP) and provide first latched data (Q) signals based on clock signal (CLKB). In various applications, the write ports (WP) may be associated with a number of D-input ports (DB0, DB1, DB2), and other inputs may include a scan input (SI) along with the DFTRAMBYP signal, and (&) the sense-amp enable signal (SE). Also, an inverted DFTRAMBYP signal may be referred to as !DFTRAMBYP signal.

In some implementations, the scan chain architecture 604 may have a number of input multiplexers (M1) that receive the D-input signals (DB0, DB1, DB2) and provide data (D) input signals to input latches (p2latch). Further, as shown in FIG. 6, the scan chain architecture 604 may have a single input latch (e.g., one p2latch) per data port that latches input data signals (DB0, DB1, DB2) provided by the input multiplexers (M1).

Also, in some applications, multiple D-input signals (DB0, DB1, DB2) may be provided to the M1 multiplexers, and output from the M1 multiplexers may be provided to the D-inputs of input latches (p2latch). Also, M1 multiplexers may provide output signals to the D-inputs of input latches (p2latch) based on the !DFTRAMBYP signal. In various applications, the M1 multiplexers may refer to 2-to-1 multiplexers; however, various other configurations may be possible.

In some implementations, the scan chain architecture 604 may include second datapath circuitry having multiplexers (M2) that receive the first latched data (Q) from the input latches (p2latch) and provide the first latched data (Q) based on a read bitline signal (RPBL). Also, in some applications, a single latched Q-output signal from multiple input latches (p2latch) per data port may be provided to M2 multiplexers, and the M2 multiplexers may provide output signals to the D-inputs of the output latches (p1latch) based on the DFTRAMBYP signal and the RPBL signal.

In some implementations, the scan chain architecture 604 may further include third datapath circuitry having output latches (p1latch) that receive the first latched data (e.g., Q output) signals from M2 multiplexers and then provide second latched data (QA0, QA1, QA2) to a number of read ports (RP) based on clock signal (CLKA). Also, in some applications, one or more of the second latched data (QA0, QA1) may be provided as feedback signals to the M1 multiplexers, and further, at least one of the second latched data signals (e.g., QA2) may be used as a scan output (SO) signal. In some applications, the CLKA signal is equal to the CLKB signal. In some applications, M2 multiplexers may refer to 2-to-1 multiplexers; however, various other configurations may be possible.

In various applications, as described in greater detail herein, the number of read ports (RP) may be equal to (=) the number of write ports (WP), and therefore, in various applications, the number of read ports (RP:R:X) is thus equal to the number of write ports (WP:W:Y), such that RP=WP. Thus, in some applications, the scan chain architecture 604 may refer to configurable scan chain architecture, wherein the scan chain architecture 604 may implemented in a 3R3W device with a memory design-for-test (DFT) design for multi-port memory applications.

For instance, in some applications, as shown in FIG. 6, the number of D-input ports (e.g., DB0, DB1, DB2) of the input latches (P2latch) may refer to 3 write ports (e.g., 3WP or 3W), and the number of read ports (e.g., QA0, QA1, QA2) of the output latches (p1latch) may refer to 3 read ports (e.g., 3RP or 3R). Thus, in some scenarios, the scan chain architecture 604 may be configured as the 3-read and 3-write (3R3W) scan chain architecture that may be used for multi-port memory architecture. Also, this configuration shown in FIG. 6 may be selectively configurable for any other number (X) of read ports (RP) and any other number (Y) or write ports (WP), e.g., as described herein.

In various implementations, clock circuitry may be used to provide clock signal (CLKB) to the input latches (p2latch) and also provide clock signal (CLKA) to the output latches (p1latch). Thus, the multiple clock signals may include a first clock signal (CLKA) that may be used as a scan shift signal during a first mode of operation, and the multiple clock signals may also include a second clock signal (CLKB) that may be used as a scan capture signal during a second mode of operation.

In various implementations, as shown in reference to FIG. 6, the input latches (p2latch) may include a single latch (one p2latch) per data bit, the output latches (p1latch) may include a single latch (one latch) per data bit, and M2 multiplexers may be coupled between the input latches (p2latch) and the output latches (p1latch). Further, in various applications, the number of input latches (e.g., one p1latch per data bit) may be equal to the number of output latches (e.g., one p1latch per data bit). Therefore, the input latches (P2latch) provide for 3 write ports (3WP:3W:3Y), and the output latches (p1latch) provide for 3 read ports (3RP:3R:3X), wherein 3RP=3WP. Thus, the number of output latches (3 p1latches) is equal to the number of input latches (3 p2latches), and thus, the number of read ports (3RP) is equal to the number of write ports (3WP).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having first datapath circuitry with input devices that receive data from a number of write ports and provide first data. The device may have second datapath circuitry with logic gates that receive the first data from the input devices and provide the first data based on a read bitline signal. The device may have third datapath circuitry with output devices that receive the first data from the logic gates and provide second data to a number of read ports. Also, the number of read ports may be greater than the number of write ports.

Described herein are various implementations of a device having first datapath circuitry with input latches that receive data from a number of write ports and provide first latched data. The device may have second datapath circuitry with logic gates that receive the first latched data from the input latches and provide the first latched data based on a read bitline signal. The device may have third datapath circuitry with output latches that receive the first latched data from the logic gates and provide second latched data to a number of read ports. Also, the number of write ports may be greater than the number of read ports.

Described herein are various implementations of a device having first datapath circuitry with input latches that receive data from a number of write ports and provide first latched data. The device may have second datapath circuitry with logic gates that receive the first latched data from the input latches and provide the first latched data based on a read bitline signal. The device may have third datapath circuitry with output latches that receive the first latched data from the logic gates and provide second latched data to a number of read ports. Also, the number of output latches is greater than the number of input latches, and the number of read ports is greater than the number of write ports.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to various implementations of various schemes and techniques described herein in reference to configurable scan chain architecture for multi-port memory, various other implementations may be devised in accordance with the disclosure herein, which may be determined by the claims that follow herein below.

Although the subject matter described herein has been described in language specific to structural features and/or methodological acts, it is to be understood that the subject matter defined in the appended claims is not necessarily limited to the specific features or acts described above. Rather, specific features and acts described herein are disclosed as example forms of implementing the claims.

What is claimed is:

1. A device comprising:
   first datapath circuitry having input devices that receive data from a number of write ports and provide first data;
   second datapath circuitry having logic gates that receive the first data from the input devices and provide the first data based on a read bitline signal; and
   third datapath circuitry having output devices that receive the first data from the logic gates and provide second data to a number of first read ports,
   wherein:
      the number of first read ports is greater than the number of write ports, and the device further comprises: one or more second read ports, wherein:
         the one or more second read ports comprise an additional quantity of read ports in comparison to the write ports, and
         the one or more second read ports are configured to capture a replication of at least a portion of the received second data during a scan capture or scan shift operation.

2. The device of claim 1, wherein the device further comprises scan chain architecture with a memory design-for-test (DFT) design for multi-port memory applications.

3. The device of claim 1, wherein:
   the input devices have multiple latches per data bit;
   the output devices have a single latch per data bit; and the logic gates are coupled between the input devices and the output devices,
wherein the logic gates combine the first data from the multiple latches into single latched data provided to the output devices.

4. The device of claim 1, wherein the number of input devices is greater than the number of output devices.

5. The device of claim 1, wherein the input devices comprise two (2) latches per data bit, and wherein the output devices comprise one (1) latch per data bit.

6. The device of claim 1, wherein the number of write ports is equal to or greater than two, and wherein the number of first read ports is equal to or greater than three, and wherein the number of first read ports is at least greater than the number of write ports.

7. The device of claim 1, wherein:
the logic gates include multiple logic gates including a first logic gate and a second logic gate,
the first logic gate receives multiple first data from at least two (2) input latches of the input devices and then provides single first latched data to the second logic gate, and
the second logic gate receives the single first latched data from the first logic gate, receives the read bitline signal, and provides the single first latched data to an output latch based on a design-for-test (DFT) signal.

8. A device comprising:
first datapath circuitry having input latches that receive data from a number of write ports and provide first latched data;
second datapath circuitry having logic gates that receive the first latched data from the input latches and provide the first latched data based on a read bitline signal; and
third datapath circuitry having output latches that receive the first latched data from the logic gates and provide second latched data to a number of read ports, wherein:
the number of the write ports is greater than the number of the read ports, and
the received data, from one or more additional write ports, is configured to be captured by one or more of the read ports that receive the second latched data from the third datapath circuitry originating from at least two of the write ports during a scan capture or scan shift operation.

9. The device of claim 8, wherein the device further comprises scan chain architecture with a memory design-for-test (DFT) design for multi-port memory applications.

10. The device of claim 8, wherein:
the input latches have multiple latches per data bit;
the output latches have a single latch per data bit; and
the logic gates are coupled between the input latches and the output latches,
wherein the logic gates combine the first latched data from the multiple latches into single latched data provided to the output latches.

11. The device of claim 8, wherein the number of input latches is greater than the number of output latches.

12. The device of claim 8, wherein the input latches comprise two (2) latches per data bit, and wherein the output latches comprise one (1) latch per data bit.

13. The device of claim 8, wherein the number of read ports is equal to or greater than two, and wherein the number of write ports is equal to or greater than three, and wherein the number of write ports is at least greater than the number of read ports.

14. The device of claim 8, wherein:
the logic gates include multiple logic gates including a first logic gate and a second logic gate,
the first logic gate receives multiple first latched data from at least two (2) input latches of the input latches and then provides single first latched data to the second logic gate, and
the second logic gate receives the single first latched data from the first logic gate, receives the read bitline signal, and provides the single first latched data to the output latches based on a design-for-test (DFT) signal.

15. A device comprising:
first datapath circuitry having input latches that receive data from a number of write ports and provide first latched data;
second datapath circuitry having logic gates that receive the first latched data from the input latches and provide the first latched data based on a read bitline signal; and
third datapath circuitry having output latches that receive the first latched data from the logic gates and provide second latched data to a number of read ports,
wherein the number of output latches is greater than the number of input latches, and wherein the number of read ports is greater than the number of write ports.

16. The device of claim 15, wherein the device further comprises scan chain architecture with a memory design-for-test (DFT) design for multi-port memory applications.

17. The device of claim 15, wherein:
the input latches have a single input latch per data bit;
the output latches have a single output latch per data bit; and
the logic gates are coupled between the input latches and the output latches,
wherein the logic gates receive the first latched data from the single input latch and provide the first latched data to the single output latch based on the read bitline signal.

18. The device of claim 15, wherein the input latches comprise two (2) latches per data bit, and wherein the output latches comprise one (1) latch per data bit.

19. The device of claim 15, wherein the number of write ports is equal to or greater than two, and wherein the number of read ports is equal to or greater than three, and wherein the number of read ports is at least greater than the number of write ports.

20. The device of claim 15, wherein the number of write ports is equal to or greater than three, and wherein the number of read ports is equal to or greater than four, and wherein the number of read ports is at least greater than the number of write ports.

* * * * *